(12) United States Patent
Ying et al.

(10) Patent No.: US 11,606,069 B2
(45) Date of Patent: Mar. 14, 2023

(54) SINGLE-ENDED-TO-DIFFERENTIAL AMPLIFIER AND RADIO FREQUENCY RECEIVER

(71) Applicant: HUAWEI TECHNOLOGIES CO., LTD., Guangdong (CN)

(72) Inventors: Wenrong Ying, Shenzhen (CN); Terrie McCain, Rolling Meadows, IL (US); William Roeckner, Rolling Meadows, IL (US)

(73) Assignee: Huawei Technologies Co., Ltd., Shenzhen (CN)

( * ) Notice: Subject to any disclaimer, the term of this patent is extended or adjusted under 35 U.S.C. 154(b) by 200 days.

(21) Appl. No.: 17/100,502

(22) Filed: Nov. 20, 2020

(65) Prior Publication Data

US 2021/0075379 A1 Mar. 11, 2021

Related U.S. Application Data

(63) Continuation of application No. PCT/CN2018/093885, filed on Jun. 30, 2018.

(51) Int. Cl.
*H03F 3/45* (2006.01)
*H03F 3/193* (2006.01)

(52) U.S. Cl.
CPC ....... *H03F 3/193* (2013.01); *H03F 2200/294* (2013.01); *H03F 2200/451* (2013.01)

(58) Field of Classification Search
CPC ..... H03F 3/45; H03F 2200/06; H03F 2200/09
(Continued)

(56) References Cited

U.S. PATENT DOCUMENTS 4,558,186 A * 12/1985 Stahl ................... H04M 19/005
323/268
6,046,638 A 4/2000 Hogeboom
(Continued)

FOREIGN PATENT DOCUMENTS

CN 101132168 A 2/2008
CN 101777877 A 7/2010
(Continued)

OTHER PUBLICATIONS

Extended European Search Report issued in European Application No. 18924683.8 dated Apr. 9, 2021, 8 pages.
(Continued)

*Primary Examiner* — Henry Choe
(74) *Attorney, Agent, or Firm* — Fish & Richardson P.C.

(57) ABSTRACT

The present disclosure relates to single-ended-to-differential amplifiers and radio frequency receivers. One example single-ended-to-differential amplifier includes a first inverting amplifier, a second inverting amplifier, and a third inverting amplifier. Both an input end of the first inverting amplifier and an input end of the second inverting amplifier are coupled to an input end of the single-ended-to-differential amplifier, an output end of the first inverting amplifier is coupled to an input end of the third inverting amplifier, an output end of the second inverting amplifier is coupled to a first output end of the single-ended-to-differential amplifier, and an output end of the third inverting amplifier is coupled to a second output end of the single-ended-to-differential amplifier. An impedance element is coupled between the input end of the first inverting amplifier and the output end of the first inverting amplifier.

18 Claims, 14 Drawing Sheets

(58) Field of Classification Search
USPC .................................................. 330/301, 252
See application file for complete search history.

(56) References Cited

U.S. PATENT DOCUMENTS

| | | | |
|---|---|---|---|
| 6,563,356 B2 | 5/2003 | Fulkerson | |
| 7,119,602 B2* | 10/2006 | Davis | G06F 1/10 |
| | | | 327/415 |
| 7,327,993 B2* | 2/2008 | Khlat | H04B 1/30 |
| | | | 331/34 |
| 8,274,335 B1* | 9/2012 | Chatwin | H03F 3/08 |
| | | | 330/308 |
| 9,350,459 B2* | 5/2016 | Morita | H04B 10/693 |
| 9,590,738 B2* | 3/2017 | Morita | H03F 3/72 |
| 10,218,319 B2* | 2/2019 | Ubbesen | H03G 7/005 |
| 2014/0077879 A1 | 3/2014 | Naeini et al. | |
| 2018/0026584 A1 | 1/2018 | Park et al. | |

FOREIGN PATENT DOCUMENTS

| | | |
|---|---|---|
| CN | 102386856 A | 3/2012 |
| CN | 102946230 A | 2/2013 |
| CN | 103457543 A | 12/2013 |
| CN | 105429603 A | 3/2016 |
| CN | 105703721 A | 6/2016 |
| CN | 105991093 A | 10/2016 |
| CN | 206542380 U | 10/2017 |
| CN | 107493078 A | 12/2017 |
| EP | 3258597 A1 | 12/2017 |
| WO | 2012161406 A1 | 11/2012 |

OTHER PUBLICATIONS

Wang et al., "A 54-W Inverter-Based Low-Noise Single-Ended to Differential VGA for Second Harmonic Ultrasound Probes in 65-nm CMOS," IEEE Transactions on Circuits and Systems—II: Express Briefs, vol. 63, No. 7, Jul. 2016, 6 pages.
Office Action issued in Chinese Application No. 201880091785.4 dated Dec. 14, 2021, 14 pages (with English translation).
Office Action issued in Chinese Application No. 201880091785.4 dated Apr. 15, 2022, 7 pages (with English translation).
Xuegang et al., "Design of High Linearity LNA for UHF RFID Applications," Microelectronics, vol. 40, No. 5, Oct. 2010, 5 pages (with English abstract).
PCT International Search Report and Written Opinion in International Application No. PCT/CN2018/093885, dated Mar. 21, 2019, 16 pages.

* cited by examiner

SINGLE-ENDED-TO-DIFFERENTIAL AMPLIFIER AND RADIO FREQUENCY RECEIVER

CROSS-REFERENCE TO RELATED APPLICATIONS

This application is a continuation of International Application No. PCT/CN2018/093885, filed on Jun. 30, 2018, the disclosure of which is hereby incorporated by reference in its entirety.

TECHNICAL FIELD

This application relates to the field of electronic technologies and in particular, to a single-ended-to-differential amplifier and a radio frequency receiver.

BACKGROUND

In a front-end design of a radio frequency receiver, a low noise amplifier (LNA) is an indispensable component and determines the receiver sensitivity of the entire receiver. To reduce an area of the radio frequency receiver, use of a radio frequency port needs to be reduced. Therefore, a low noise amplifier usually uses a single-ended-to-differential circuit structure, that is, after the low noise amplifier is coupled to a radio frequency port of the radio frequency receiver, a radio frequency signal is input to the low noise amplifier through the radio frequency port, and the low noise amplifier may output a differential signal. In this way, a quantity of radio frequency ports of the radio frequency receiver can be reduced.

Currently, the low noise amplifier usually uses a passive inductor Balun to implement functions of single-ended input and differential output. Specifically, as shown in FIG. 1, the low noise amplifier includes a resistor, two metal oxide semiconductor (MOS) transistors, a passive inductor Balun, and a capacitor. After the radio frequency signal is input to the low noise amplifier, the radio frequency signal is input to the passive inductor balun through the two MOS transistors, and then converted into a differential signal through the passive inductor balun and the capacitor for output.

However, the low noise amplifier has a larger area because it uses an inductor. In addition, because the low noise amplifier uses the inductor and the capacitor as loads, the low noise amplifier is a narrowband structure, that is, the low noise amplifier has relatively small frequency range. In this case, a plurality of low noise amplifiers need to be used at the same time to implement broadband coverage. This further increases the area of the radio frequency receiver.

SUMMARY

This application provides a single-ended-to-differential amplifier and a radio frequency receiver to implement single-ended-to-differential based on signal amplification without significantly increasing an area of the single-ended-to-differential amplifier. The technical solutions are as follows.

According to a first aspect, a single-ended-to-differential amplifier is provided, where the single-ended-to-differential amplifier includes a first inverting amplifier, a second inverting amplifier, and a third inverting amplifier. Both an input end of the first inverting amplifier and an input end of the second inverting amplifier are coupled to an input end of the single-ended-to-differential amplifier, an output end of the first inverting amplifier is coupled to an input end of the third inverting amplifier, an output end of the second inverting amplifier is coupled to a first output end of the single-ended-to-differential amplifier, and an output end of the third inverting amplifier is coupled to a second output end of the single-ended-to-differential amplifier; and an impedance element is coupled between the input end of the first inverting amplifier and the output end of the first inverting amplifier.

In this embodiment of this application, there may be no inductor in the single-ended-to-differential amplifier. Therefore, the single-ended-to-differential amplifier has a smaller area and a larger frequency range, to implement broadband matching. In this way, a wide frequency range can be covered by using only a small quantity of single-ended-to-differential amplifiers, so that an area of the single-ended-to-differential amplifier can be reduced.

Specifically, when the single-ended-to-differential amplifier is working, a radio frequency signal is input to the input end of the single-ended-to-differential amplifier and then input to the first inverting amplifier and the third inverting amplifier. After the radio frequency signal is input to the first inverting amplifier, the first inverting amplifier outputs a first signal whose phase is opposite to a phase of the radio frequency signal. After the first signal is input to the third inverting amplifier, the third inverting amplifier outputs a second signal whose phase is opposite to the phase of the first signal. After the radio frequency signal is input to the second inverting amplifier, the second inverting amplifier outputs a third signal whose phase is opposite to the phase of the radio frequency signal. In this case, the second output end of the single-ended-to-differential amplifier outputs the second signal, the first output end of the single-ended-to-differential amplifier outputs the third signal, where the phase of the second signal is opposite to the phase of the third signal. In this way, the radio frequency signal is converted into a differential signal including the second signal and the third signal.

The first inverting amplifier, the second inverting amplifier, and the third inverting amplifier in the single-ended-to-differential amplifier may be implemented through a MOS technology. Therefore, there may be no inductor, and the single-ended-to-differential amplifier has a smaller area and a larger frequency range, to implement broadband matching. In this way, a wide frequency range can be covered by using a small quantity of single-ended-to-differential amplifiers, so that a quantity of radio frequency ports can be further reduced, and an area of the single-ended-to-differential amplifier can be reduced.

It should be noted that the first inverting amplifier may be a unity-gain inverting amplifier, and a gain of the second inverting amplifier may be the same as a gain of the third inverting amplifier. Alternatively, the first inverting amplifier may be a non-unity-gain inverting amplifier, and a product of a gain of the first inverting amplifier and the gain of the third inverting amplifier may be an opposite number of the gain of the second inverting amplifier.

The first inverting amplifier includes a first P-metal-oxide-semiconductor (PMOS) transistor and a first n-metal-oxide-semiconductor (NMOS) transistor. A source of the first PMOS transistor is coupled to a first power supply, a drain of the first PMOS transistor is coupled to a drain of the first NMOS transistor, and a source of the first NMOS transistor is grounded. The drain of the first PMOS transistor is coupled to the output end of the first inverting amplifier, the drain of the first NMOS transistor is coupled to the output end of the first inverting amplifier. Both the drain of the first PMOS transistor and the drain of the first NMOS transistor are coupled to the input end of the first inverting amplifiers through the impedance element. Both a gate of the first PMOS transistor and a gate of the first NMOS transistor are coupled to the input end of the first inverting amplifier.

In this embodiment of this application, after both the drain of the first PMOS transistor and the drain of the first NMOS transistor are coupled to the input end of the first inverting amplifier through the impedance element, a feedback channel is formed from the first PMOS transistor and the first NMOS transistor to the input end of the first inverting amplifier. In this case, a reciprocal of a sum of a transconductance value of the first PMOS transistor and a transconductance value of the first NMOS transistor is an input impedance of the first inverting amplifier. Therefore, impedance matching of the input end of the single-ended-to-differential amplifier can be implemented by designing the transconductance value of the first PMOS transistor and the transconductance value of the first NMOS transistor.

In addition, noise of the first PMOS transistor and noise of the first NMOS transistor are output to the second output end of the single-ended-to-differential amplifier through the third inverting amplifier and are output to the first output end of the single-ended-to-differential amplifier through the feedback channel and the second inverting amplifier. In this case, the noise caused by the first PMOS transistor and the first NMOS transistor at the second output end of the single-ended-to-differential amplifier has an equal magnitude and a same phase as the noise caused by the first PMOS transistor and the first NMOS transistor at the first output end of the single-ended-to-differential amplifier, and can cancel each other. Therefore, the first PMOS transistor and the first NMOS transistor do not cause noise to the differential signal output by the single-ended-to-differential amplifier, thereby greatly improving noise performance of the single-ended-to-differential amplifier.

The impedance element may include at least one of a first resistor and a sixth capacitor. In other words, at least one of the first resistor and the sixth capacitor may be connected in series between the drain of the first PMOS transistor and the drain of the first NMOS transistor and the input end of the first inverting amplifier.

Further, the first inverting amplifier may include a second PMOS transistor and a second NMOS transistor. The drain of the first PMOS transistor is coupled to a source of the second PMOS transistor, a drain of the second PMOS transistor is coupled to a drain of the second NMOS transistor, and a source of the second NMOS transistor is coupled to the drain of the first NMOS transistor. A gate of the second PMOS transistor is coupled to a first bias voltage, and a gate of the second NMOS transistor is coupled to a second bias voltage. Both the drain of the second PMOS transistor and the drain of the second NMOS transistor are coupled to the output end of the first inverting amplifier through the impedance element. The drain of the first PMOS transistor is coupled to a third output end of the first inverting amplifier, and the drain of the first NMOS transistor is coupled to a fourth output end of the first inverting amplifier.

In this embodiment of this application, a signal swing between a coupling point (that is, a feedback point of the feedback channel) of the drain of the second PMOS transistor and the drain of the second NMOS transistor and the impedance element depends on impedance of the impedance element. Therefore, the signal swing of the feedback point can be adjusted by designing the impedance of the impedance element, to improve linearity performance of the single-ended-to-differential amplifier. In addition, because a channel formed by the first PMOS transistor, the second PMOS transistor, the first NMOS transistor, and the second NMOS transistor is in a high-impedance state. Therefore, noise of the impedance element is difficult to be output into the second output end of the single-ended-to-differential amplifier. In other words, the impedance element does not introduce obvious noise.

Further, the first inverting amplifier further includes a first capacitor, coupled between the third output end and the fourth output end. In this case, both a load of the first PMOS transistor and a load of the first NMOS transistor are a parallel structure of the second PMOS transistor and the second NMOS transistor. Therefore, even if the signal swing is large, at least one of the second PMOS transistor and the second NMOS transistor is ensured to be conducted and normal output of the first inverting amplifier is ensured. In this way, the load of the first PMOS transistor and the load of the first NMOS transistor are more linear, thereby effectively improving the linearity performance of the single-ended-to-differential amplifier.

In this embodiment of this application, the first PMOS transistor and the second PMOS transistor are a complementary input structure to the first NMOS transistor and the second NMOS transistor. Therefore, even if the signal swing is large, an output channel of the first inverting amplifier can always be conducted. This ensures performance of a 1 dB compression point of the single-ended-to-differential amplifier.

Further, the first inverting amplifier further includes a second capacitor, where at least one of the gate of the first PMOS transistor and the gate of the first NMOS transistor is coupled to the input end of the first inverting amplifier through the second capacitor. The second capacitor has a direct-current blocking function, so that a direct-current signal of the input end of the first inverting amplifier can be prevented from affecting at least one direct-current working point of the first PMOS transistor and the first NMOS transistor.

The third inverting amplifier includes a third PMOS transistor and a third NMOS transistor, where a source of the third PMOS transistor is coupled to a second power supply, a drain of the third PMOS transistor is coupled to a drain of the third NMOS transistor, and a source of the third NMOS transistor is grounded. Both the drain of the third PMOS transistor and the drain of the third NMOS transistor are coupled to the output end of the third inverting amplifier. A gate of the third PMOS transistor is coupled to the third output end, and a gate of the third NMOS transistor is coupled to the fourth output end.

In this embodiment of this application, the third PMOS transistor and the third NMOS transistor form an inverter structure, so that an output signal of the third inverting amplifier can have a large swing, thereby effectively improving a dynamic range of the single-ended-to-differential amplifier.

Further, the third inverting amplifier includes a third capacitor, where both the drain of the third PMOS transistor and the drain of the third NMOS transistor are coupled to the output end of the third inverting amplifier through the third capacitor. The third capacitor has a direct-current blocking function, so that a direct-current signal in the single-ended-to-differential amplifier can be prevented from affecting a direct-current working point of a next-stage circuit, thereby ensuring normal working of the next-stage circuit.

Further, the third inverting amplifier includes a fourth capacitor and a fifth capacitor, where the gate of the third PMOS transistor is coupled to the third output end through the fourth capacitor, and the gate of the third NMOS transistor is coupled to the fourth output end through the fifth capacitor. The fourth capacitor has a direct-current blocking function, so that a direct-current signal of the third output end of the first inverting amplifier can be prevented from affecting a direct-current working point of the third PMOS transistor. The fifth capacitor also has a direct-current blocking function, so that a direct-current signal of the fourth output end of the first inverting amplifier can be prevented from affecting a direct-current working point of the third NMOS transistor.

The second inverting amplifier includes a fourth PMOS transistor and a fourth NMOS transistor, where a source of the fourth PMOS transistor is coupled to the second power supply, a drain of the fourth PMOS transistor is coupled to a drain of the fourth NMOS transistor, and a source of the fourth NMOS transistor is grounded. Both the drain of the fourth PMOS transistor and the drain of the fourth NMOS transistor are coupled to the output end of the second inverting amplifier. Both a gate of the fourth PMOS transistor and a gate of the fourth NMOS transistor are coupled to the input end of the second inverting amplifier.

In this embodiment of this application, the fourth PMOS transistor and the fourth NMOS transistor form an inverter structure, so that an output signal of the second inverting amplifier can have a large swing, thereby effectively improving a dynamic range of the single-ended-to-differential amplifier.

Further, the second inverting amplifier further includes a seventh capacitor, where both the drain of the fourth PMOS transistor and the drain of the fourth NMOS transistor are coupled to the output end of the second inverting amplifier through the seventh capacitor. The seventh capacitor has a direct-current blocking function, so that the direct-current signal in the single-ended-to-differential amplifier can be prevented from affecting a direct-current working point of a next-stage circuit, thereby ensuring normal working of the next-stage circuit.

Further, the second inverting amplifier further includes an eighth capacitor, where both the gate of the fourth PMOS transistor and the gate of the fourth NMOS transistor are coupled to the input end of the second inverting amplifier through the eighth capacitor. The eighth capacitor has a direct-current blocking function, so that a direct-current signal of the input end of the second inverting amplifier can be prevented from affecting a direct-current working point of the fourth PMOS transistor.

According to a second aspect, a radio frequency receiver is provided, and the radio frequency receiver includes the single-ended-to-differential amplifier according to the first aspect.

In a possible implementation, the single-ended-to-differential amplifier may be a single-ended-to-differential low noise amplifier. The radio frequency receiver may further include a mixer, and the mixer may be coupled to a first output end and a second output end of the low noise amplifier.

According to a third aspect, a radio frequency chip is provided, including the single-ended-to-differential amplifier according to the first aspect or the radio frequency receiver according to the second aspect.

According to a fourth aspect, a communications apparatus is provided, including the radio frequency chip according to the third aspect. Optionally, the communications apparatus is a wireless terminal.

Technical effects obtained in the second aspect, the third aspect and the fourth aspect are similar to the technical effects obtained through a corresponding technical means in the first aspect. Details are not described herein again.

REFERENCE SIGNS

Figure 1:
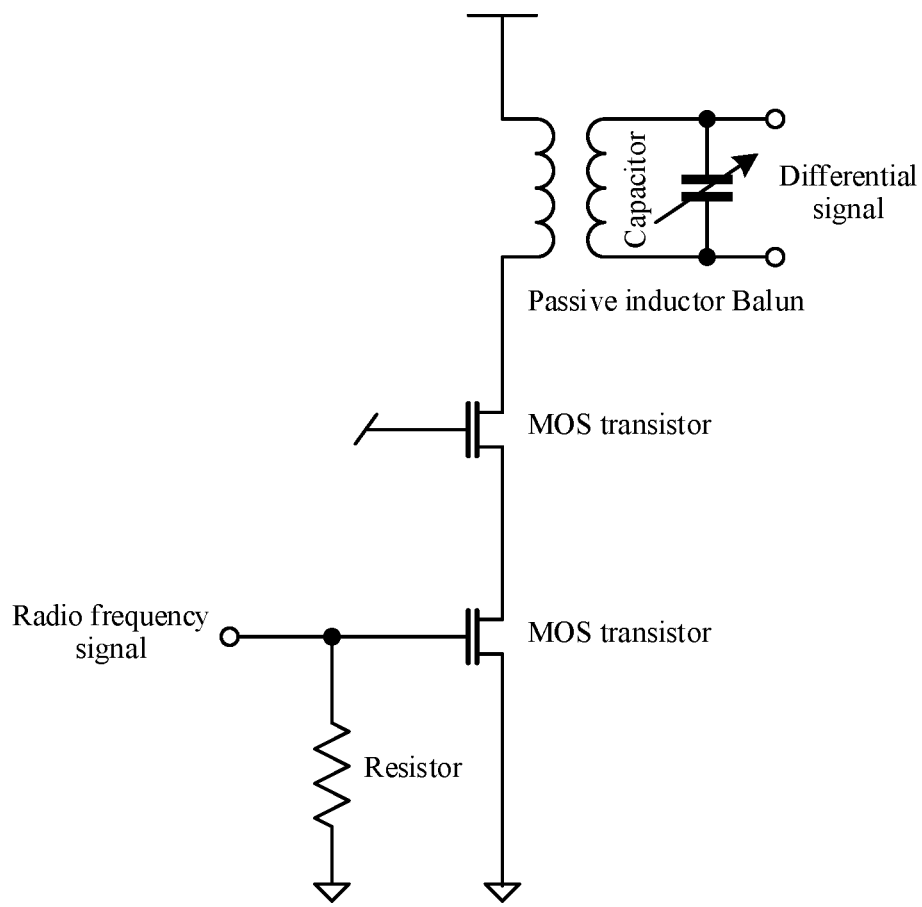
FIG. 1 is a schematic structural diagram of a low noise amplifier provided in related prior art.

La: an input end of a low noise amplifier, Lb: a first output end of the low noise amplifier, Lc: a second output end of the low noise amplifier;

1: a first inverting amplifier, 1a: an input end of the first inverting amplifier, 1b: an output end of the first inverting amplifier, 1c: a third output end of the first inverting amplifier, 1d: a fourth output end of the first inverting amplifier, 2: a second inverting amplifier, 2a: an input end of the second inverting amplifier, 2b: an output end of the second inverting amplifier, 3: a third inverting amplifier, 3a: an input end of the third inverting amplifier, 3b: an output end of the third inverting amplifier;

Q11: a first PMOS transistor, s11: a source of the first PMOS transistor, d11: a drain of the first PMOS transistor, g11: a gate of the first PMOS transistor, Q12: a first NMOS transistor, s12: a source of the first NMOS transistor; d12: a drain of the first NMOS transistor, g12: a gate of the first NMOS transistor, Q21: a second PMOS transistor, s21: a source of the second PMOS transistor, d21: a drain of the second PMOS transistor, g21: a gate of the second PMOS transistor, Q22: a second NMOS transistor, s22: a source of the second NMOS transistor, d22: a drain of the second NMOS transistor, g22: a gate of the second NMOS transistor, Q31: a third PMOS transistor, s31: a source of the third PMOS transistor, d31: a drain of the third PMOS transistor, g31: a gate of the third PMOS transistor, Q32: a third NMOS transistor, s32: a source of the third NMOS transistor, d32: a drain of the third NMOS transistor, g32: a gate of the third NMOS transistor, Q41: a fourth PMOS transistor, s41: a source of the fourth PMOS transistor, d41: a drain of the fourth PMOS transistor, g41: a gate of the fourth PMOS transistor, Q42: a fourth NMOS transistor, s42: a source of the fourth NMOS transistor, d42: a drain of the fourth NMOS transistor, g42: a gate of the fourth NMOS transistor;

Z: an impedance element, R1: a first resistor, R2: a second resistor, C1: a first capacitor, C2: a second capacitor, C3: a third capacitor, C4: a fourth capacitor, C5: a fifth capacitor, C6: a sixth capacitor, C7: a seventh capacitor, C8: an eighth capacitor.

DESCRIPTION OF EMBODIMENTS

To make the objectives, technical solutions, and advantages of this application clearer, the following further describes the embodiments of this application in detail with reference to the accompanying drawings.

Before the embodiments of this application are explained in detail, an application scenario involved in the embodiments of this application are described first.

As a radio frequency receiver is widely applied, there is an increasingly urgent requirement for reducing costs of the radio frequency receiver. Therefore, a low noise amplifier with a single-to-dual circuit structure is usually used in the radio frequency receiver to reduce use of a radio frequency port. A single-ended-to-differential amplifier provided in the embodiments of this application is applied to the radio frequency receiver. For ease of understanding, the following uses an example in which the single-ended-to-differential amplifier is a single-ended-to-differential low noise amplifier for description.

Figure 2:
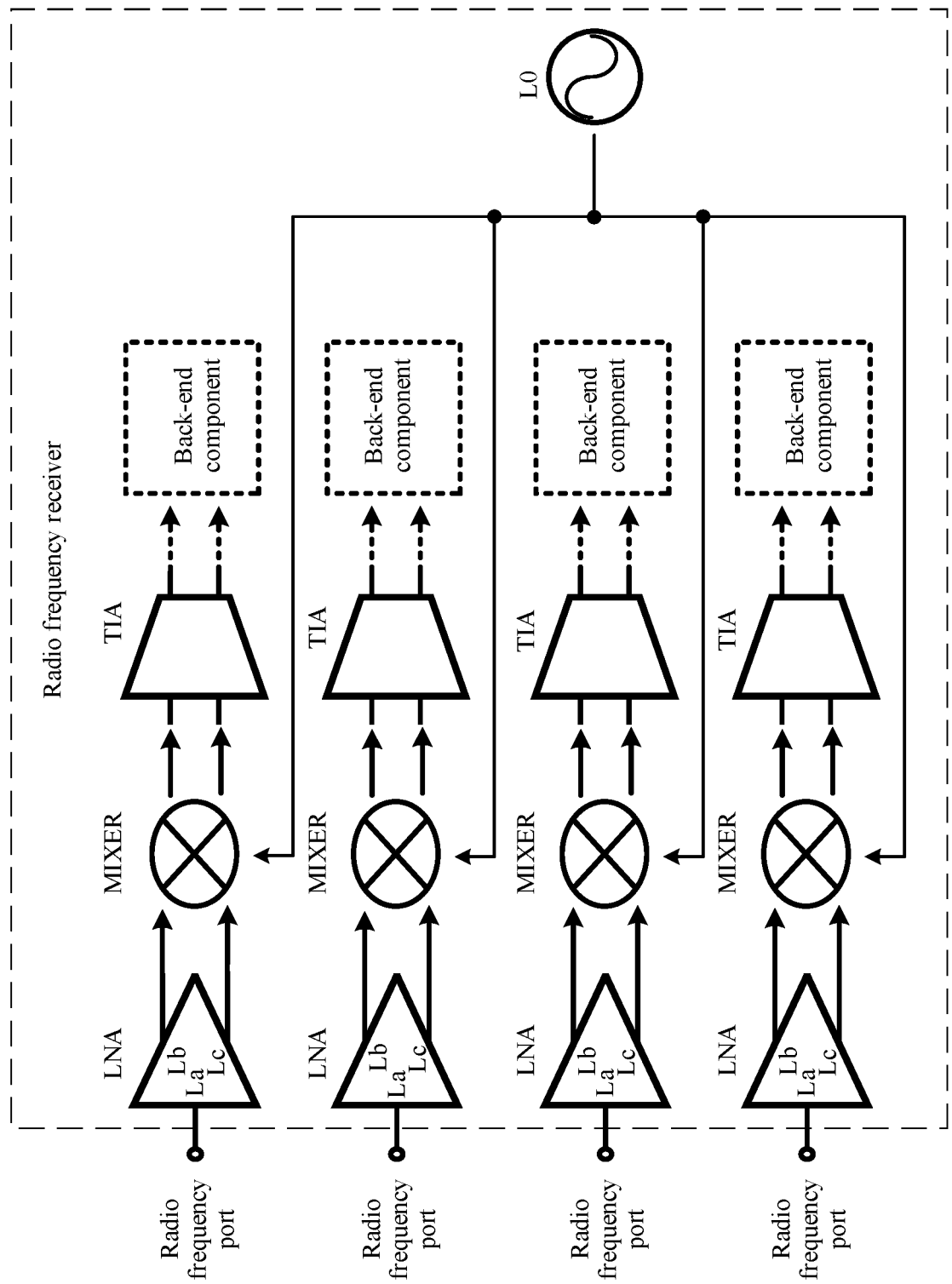
FIG. 2 is a schematic structural diagram of a radio frequency receiver according to an embodiment of this application.

FIG. 2 is a schematic structural diagram of a radio frequency receiver according to an embodiment of this application. The radio frequency receiver may be located in a radio frequency chip. A radio frequency port of the radio frequency receiver is a radio frequency input port of the radio frequency chip, and is configured to input a radio frequency signal. Refer to FIG. 2. The radio frequency receiver may include at least one radio frequency channel. Each radio frequency channel is coupled to one radio frequency port, and each radio frequency channel may include a low noise amplifier (LNA), a mixer, and a trans-impedance amplifier (TIA). The low noise amplifier and the mixer are connected to the trans-impedance amplifier in series, and output a signal to a back-end component for processing. The back-end component may include an analog-to-digital converter (ADC), and the like. Further, the radio frequency chip is located in a communications apparatus. The communications apparatus may be various wireless communications apparatuses such as a base station, a relay station, a repeater, a retransmitting station, a remote radio head (RRH), a wireless terminal, user equipment, a personal computer, a laptop computer, a tablet computer, or an Internet of Things device. This is not limited in this embodiment.

It may be understood that the radio frequency chip mentioned above is an integrated semiconductor chip, and may be manufactured using a semiconductor manufacturing process. In addition, the radio frequency receiver may be included in the radio frequency chip, or may be used as a part of a discrete system. To be specific, a plurality of components in the system are not an integrated circuit in an integrated chip, but discrete components. Therefore, each part of the radio frequency receiver may also be formed by discrete components. Whether a specific circuit structure uses an integrated circuit technology or a part of the integrated circuit that forms a chip is not limited in the following embodiments.

The low noise amplifier may be a low noise amplifier shown in any one of FIG. 3 to FIG. 14. An input end La of the low noise amplifier may be coupled to the radio frequency port of the radio frequency receiver. A first output end Lb of the low noise amplifier and a second output end Lc of the low noise amplifier may be coupled to the mixer. The low noise amplifier may convert the radio frequency signal input through the radio frequency port into a differential signal, and input the differential signal to the mixer. The mixer may perform mixing on the differential signal and a local oscillator signal (LO) to obtain an intermediate frequency signal, and input the intermediate frequency signal to the trans-impedance amplifier. The trans-impedance amplifier may convert the intermediate frequency signal into a voltage signal, and output the voltage signal to the back-end component for processing.

In the foregoing embodiment, the radio frequency signal received and processed by the radio frequency receiver may be a service data signal, a wireless control signal, a wireless scheduling signal, a pilot signal, a radio broadcast signal, a physical layer or a higher-layer communication protocol signal, or a combination thereof. By receiving and processing the radio frequency signal, the radio frequency receiver and a communications apparatus in which the radio frequency receiver is located may implement a communication operation with another communications apparatus that sends the radio frequency signal.

Figure 3:
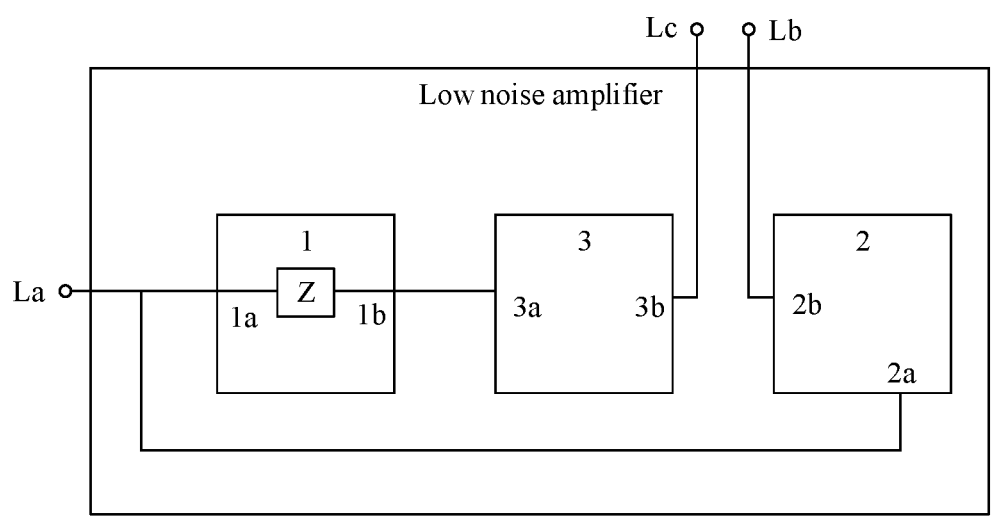
FIG. 3 is a schematic structural diagram of a first low noise amplifier according to an embodiment of this application.

FIG. 3 is a schematic structural diagram of a low noise amplifier according to an embodiment of this application. Refer to FIG. 3. The low noise amplifier may include a first inverting amplifier 1, a second inverting amplifier 2, and a third inverting amplifier 3. Both an input end 1a of the first inverting amplifier 1 and an input end 2a of the second inverting amplifier 2 are coupled to the input end La of the low noise amplifier, an output end 1b of the first inverting amplifier 1 is coupled to an input end 3a of the third inverting amplifier 3, an output end 2b of the second inverting amplifier 2 is coupled to the first output end Lb of the low noise amplifier, and an output end 3b of the third inverting amplifier 3 is coupled to the second output end Lc of the low noise amplifier. An impedance element Z is coupled between the input end 1a of the first inverting amplifier 1 and the output end 1b of the first inverting amplifier 1.

It should be noted that the first inverting amplifier 1, the second inverting amplifier 2, and the third inverting amplifier 3 can all implement a phase inversion function. To be specific, a phase of a signal output by the output end 1b of the first inverting amplifier 1 is opposite to a phase of a signal input by the input end 1a of the first inverting amplifier 1, a phase of a signal output by the output end 2b of the second inverting amplifier 2 is opposite to a phase of a signal input by the input end 2a of the second inverting amplifier 2, and a phase of a signal output by the output end 3b of the third inverting amplifier 3 is opposite to a phase of a signal input by the input end 3a of the third inverting amplifier 3.

In addition, to ensure that a signal output by the low noise amplifier is a differential signal, to be specific, to ensure that the signal output by the second inverting amplifier 2 and the signal output by the third inverting amplifier 3 have an equal amplitude and opposite phases, the first inverting amplifier 1 may be a unity-gain inverting amplifier, and a gain of the second inverting amplifier may be the same as a gain of the third inverting amplifier. In this case, an output impedance of the second inverting amplifier 2 is equal to an output impedance of the third inverting amplifier 3. Certainly, the first inverting amplifier 1 may alternatively be a non-unity-gain inverting amplifier. In this case, a product of a gain of the first inverting amplifier 1 and the gain of the third inverting amplifier 3 may be an opposite number of the gain of the second inverting amplifier 2. A person skilled in the art may understand that a gain of each inverting amplifier in this embodiment may be set according to an actual application requirement, so that the gain of the low noise amplifier may be set to a required value. To be specific, the value is jointly determined by the gain of the first inverting amplifier 1, the gain of the second inverting amplifier 2, and the gain of the third inverting amplifier 3. Optionally, the gain of the low noise amplifier may be set to be adjustable, that is, adjustment may be performed between a plurality of different values. In this case, the gain of each corresponding inverting amplifier is adjustable. Regardless of how the entire low noise amplifier is adjusted, differential output may be implemented provided that it is ensured that the product of the gain of the first inverting amplifier 1 and the gain of the third inverting amplifier 3 is approximately equal to the opposite number of the gain of the second inverting amplifier 2. Therefore, a person skilled in the art may set the gains of the three inverting amplifiers according to an actual application requirement in a circuit design process. In addition, in a setting process, the person skilled in the art only needs to ensure that the product of the gain of the first inverting amplifier 1 and the gain of the third inverting amplifier 3 is approximately equal to the opposite number of the gain of the second inverting amplifier 2. This ensures that two signals that are differentially output by the low noise amplifier are input signals that are amplified at the same amplitude but have opposite phases.

Specifically, when the low noise amplifier is working, the radio frequency signal is input to the input end La of the low noise amplifier and then input to the first inverting amplifier 1 and the third inverting amplifier 3. After the radio frequency signal is input to the first inverting amplifier 1, the first inverting amplifier 1 outputs a first signal whose phase is opposite to a phase of the radio frequency signal. After the first signal is input to the third inverting amplifier 3, the third inverting amplifier 3 outputs a second signal whose phase is opposite to the phase of the first signal. After the radio frequency signal is input to the second inverting amplifier 2, the second inverting amplifier 2 outputs a third signal whose phase is opposite to the phase of the radio frequency signal. In this case, the second output end Lc of the low noise amplifier outputs the second signal, the first output end Lb of the low noise amplifier outputs the third signal, where the phase of the second signal is opposite to the phase of the third signal. In this way, the radio frequency signal is converted into the differential signal including the second signal and the third signal.

It should be noted that the low noise amplifier uses a single-ended-to-differential circuit structure. The input end La of the low noise amplifier is coupled to the radio frequency port. After the radio frequency signal is input to the input end La of the low noise amplifier through the radio frequency port, the first output end Lb and the second output end Lc of the low noise amplifier may output the differential signal, to implement functions of single-ended input and differential output. Compared with a low noise amplifier that requires differential input in a related technology, the low noise amplifier in this embodiment of this application can greatly reduce a quantity of radio frequency ports.

In addition, the first inverting amplifier 1, the second inverting amplifier 2, and the third inverting amplifier 3 of the low noise amplifier may be implemented through a MOS technology. Therefore, there may be no inductor, and the low noise amplifier may have a smaller area and a larger frequency range, to implement broadband matching. In this way, a small quantity of low noise amplifiers can cover a wide frequency range, so that a quantity of radio frequency ports can be further reduced, and an area of the radio frequency receiver including the low noise amplifier can be reduced. For example, when the low noise amplifier is used, no other low noise amplifier needs to be used below 3 GHz, and only one same low noise amplifier needs to be used between 3 GHz and 6 GHz. In this case, a single low noise amplifier can implement broadband coverage.

Figure 4:
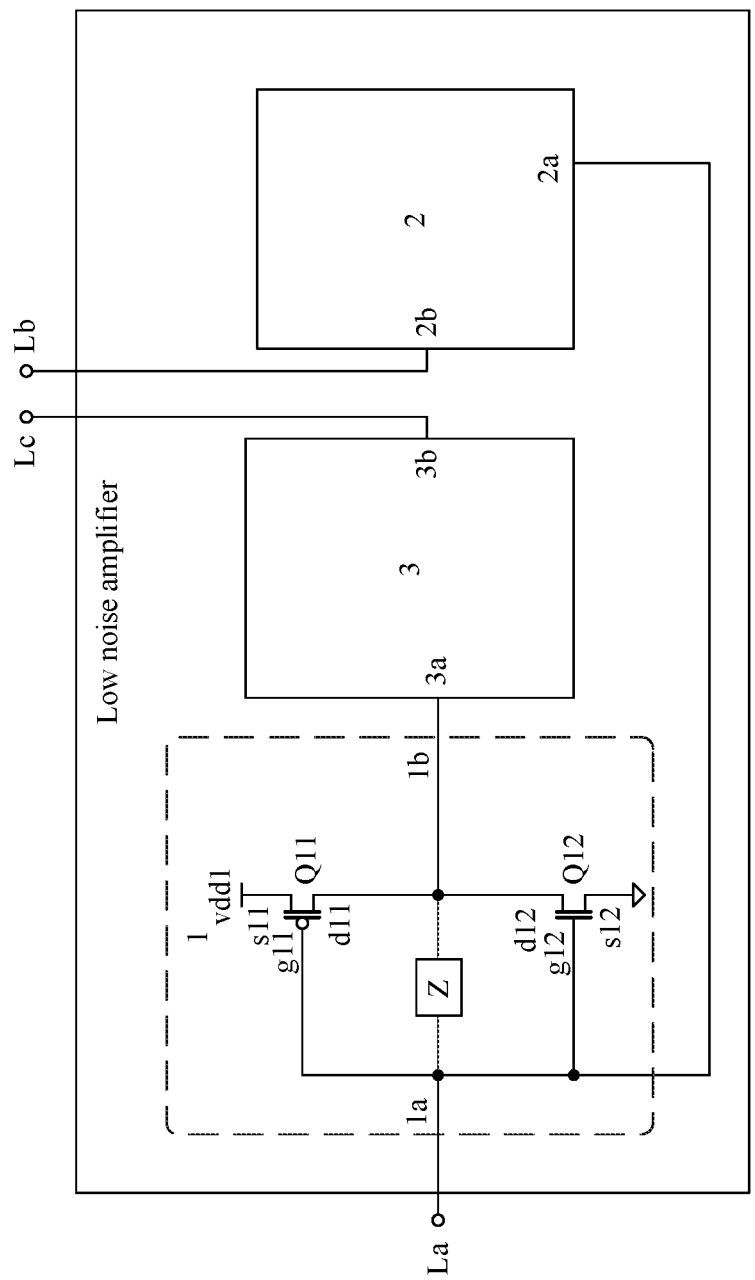
FIG. 4 is a schematic structural diagram of a second low noise amplifier according to an embodiment of this application.

The following describes a structure of the first inverting amplifier 1. Refer to FIG. 4. The first inverting amplifier 1 includes a first PMOS transistor Q11 and a first NMOS transistor Q12. A source s11 of the first PMOS transistor Q11 is coupled to a first power supply vdd1, a drain d11 of the first PMOS transistor Q11 is coupled to a drain d12 of the first NMOS transistor Q12, and a source s12 of the first NMOS transistor Q12 is grounded. The drain d11 of the first PMOS transistor Q11 is coupled to the output end 1b of the first inverting amplifier 1, and the drain d12 of the first NMOS transistor Q12 is coupled to the output end 1b of the first inverting amplifier 1. Both the drain d11 of the first PMOS transistor Q11 and the drain d12 of the first NMOS transistor Q12 are coupled to the input end 1a of the first inverting amplifier 1 through the impedance element Z. Both a gate g11 of the first PMOS transistor Q11 and a gate g12 of the first NMOS transistor Q12 are coupled to the input end 1a of the first inverting amplifier 1.

It should be noted that, after both the drain d11 of the first PMOS transistor and the drain d12 of the first NMOS transistor Q12 are coupled to the input end 1a of the first inverting amplifier 1 through the impedance element Z, a feedback channel is formed from the first PMOS transistor Q11 and the first NMOS transistor Q12 to the input end of the first inverting amplifier 1. In this case, a reciprocal of a sum of a transconductance value of the first PMOS transistor Q11 and a transconductance value of the first NMOS transistor Q12 is an input impedance of the first inverting amplifier 1. Therefore, impedance matching of the input end La of the low noise amplifier can be implemented by designing the transconductance value of the first PMOS transistor Q11 and the transconductance value of the first NMOS transistor Q12. For example, it may be designed that the sum of the transconductance value of the first PMOS transistor Q11 and the transconductance value of the first NMOS transistor Q12 is 0.02 siemen (S). In this case, the input impedance of the first inverting amplifier 1 is 1/0.02=50 ohms, so that impedance matching of the input end La of the low noise amplifier can be implemented.

In addition, noise of the first PMOS transistor Q11 and noise of the first NMOS transistor Q12 are output to the second output end Lc of the low noise amplifier through the third inverting amplifier 3 and are output to the first output end Lb of the low noise amplifier through the feedback channel and the second inverting amplifier 2. In this case, the noise caused by the first PMOS transistor Q11 and the first NMOS transistor Q12 at the second output end Lc of the low noise amplifier has an equal magnitude and a same phase as the noise caused by the first PMOS transistor Q11 and the first NMOS transistor Q12 at the first output end Lb of the low noise amplifier, and can cancel each other. According to such a noise cancellation mechanism introduced in this embodiment of this application, the first PMOS transistor Q11 and the first NMOS transistor Q12 do not cause noise to the differential signal output by the low noise amplifier, greatly improving noise performance of the low noise amplifier.

Figure 5:
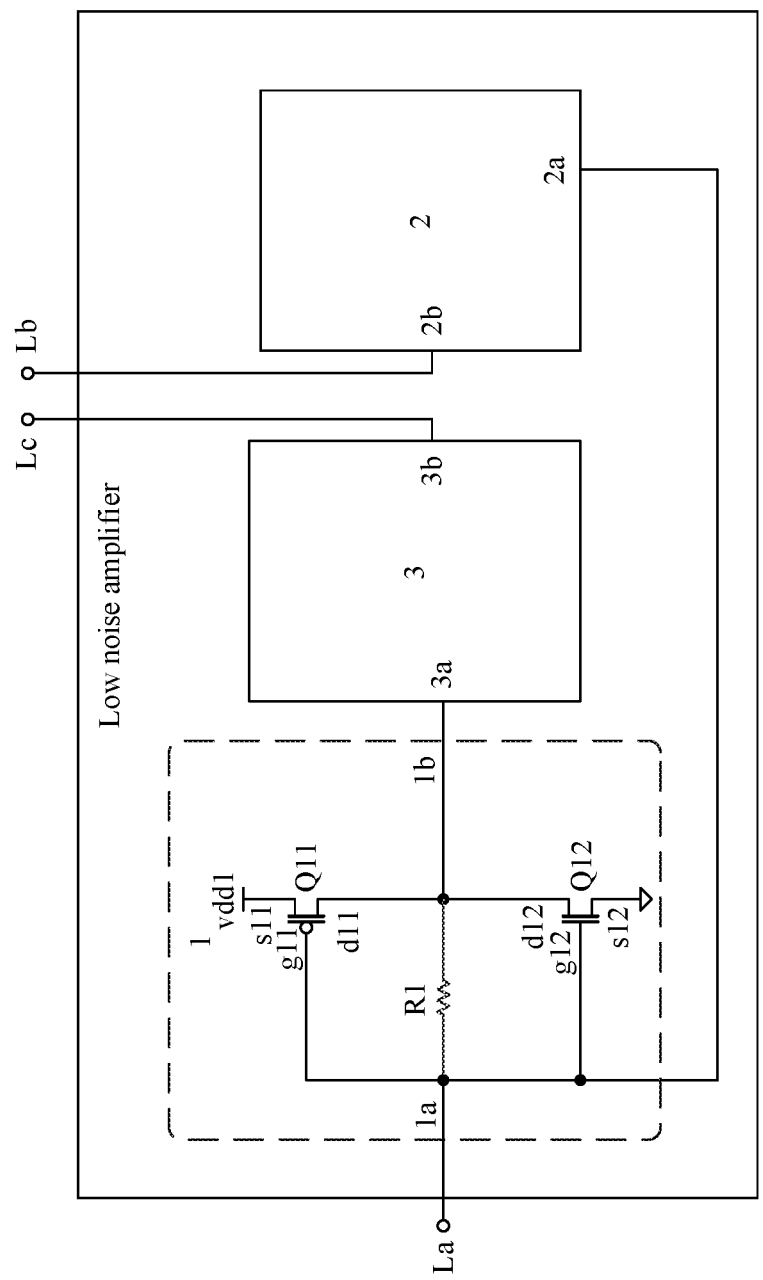
FIG. 5 is a schematic structural diagram of a third low noise amplifier according to an embodiment of this application.
Figure 6:
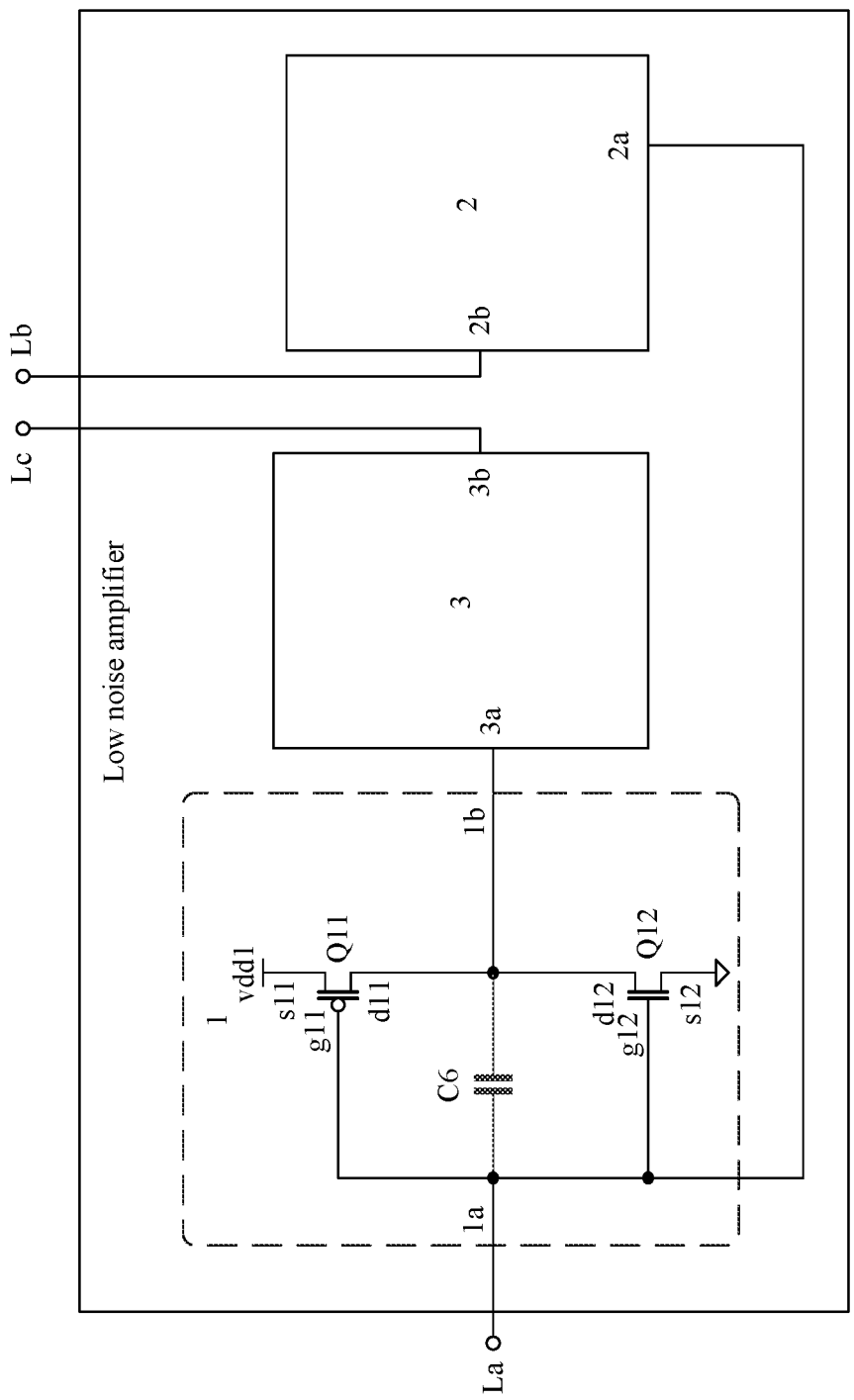
FIG. 6 is a schematic structural diagram of a fourth low noise amplifier according to an embodiment of this application.
Figure 7:
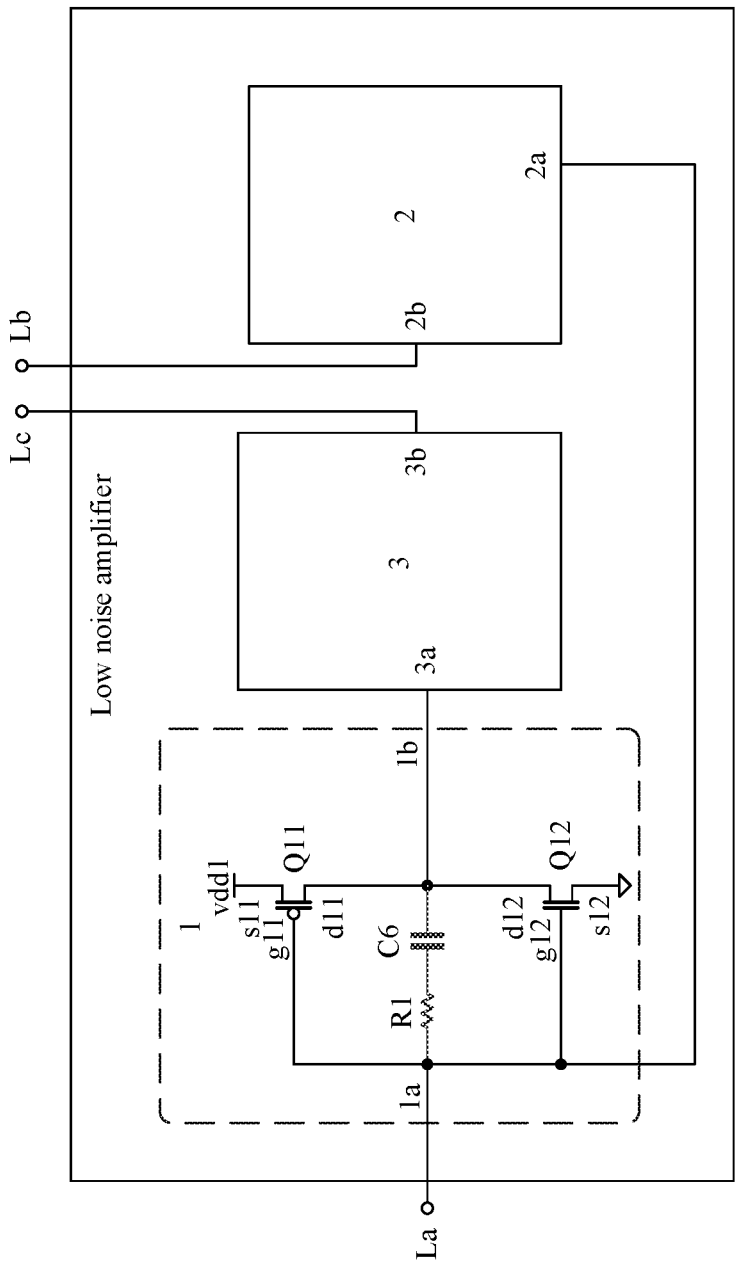
FIG. 7 is a schematic structural diagram of a fifth low noise amplifier according to an embodiment of this application.

Further, refer to FIG. 5, FIG. 6, and FIG. 7. The impedance element Z may include at least one of a first resistor R1 and a sixth capacitor C6. Both the drain d11 of the first PMOS transistor Q11 and the drain d12 of the first NMOS transistor Q12 are coupled to the input end 1a of the first inverting amplifier 1 through at least one of the first resistor R1 and the sixth capacitor C6. In other words, at least one of the first resistor R1 and the sixth capacitor C6 may be connected in series between the drain d11 of the first PMOS transistor Q11 and the drain d12 of the first NMOS transistor Q12 and the input end 1a of the first inverting amplifier 1.

Figure 8:
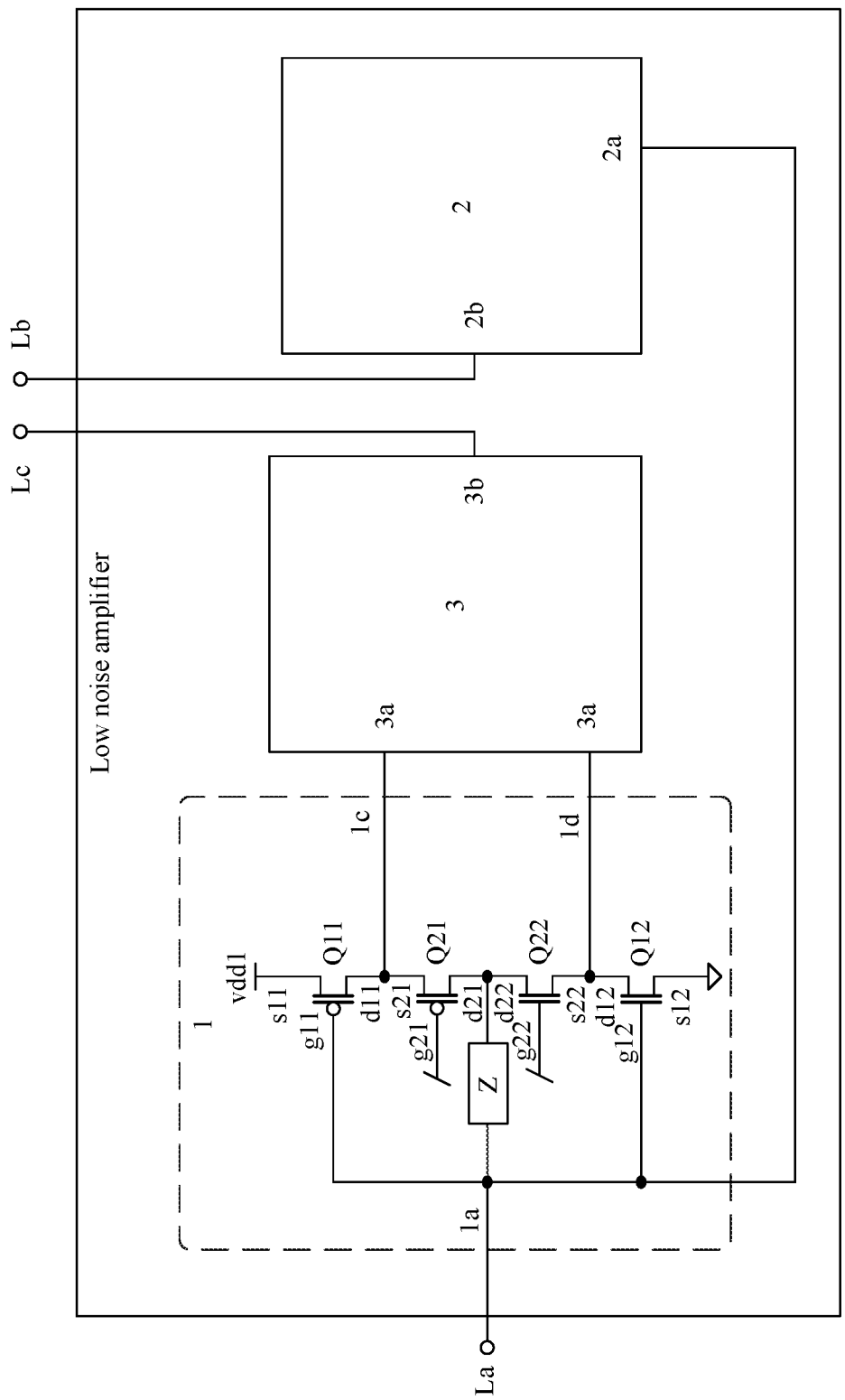
FIG. 8 is a schematic structural diagram of a sixth low noise amplifier according to an embodiment of this application.

Further, refer to FIG. 8. The first inverting amplifier 1 may include a second PMOS transistor Q21 and a second NMOS transistor Q22, configured to couple the drain d11 of the first PMOS transistor Q11 and the drain d12 of the first NMOS transistor Q12. Specifically, the drain d11 of the first PMOS transistor Q11 is coupled to a source s21 of the second PMOS transistor Q21, a drain d21 of the second PMOS transistor Q21 is coupled to a drain d22 of the second NMOS transistor Q22, a source s22 of the second NMOS transistor Q22 is coupled to the drain d12 of the first NMOS transistor Q12. A gate g21 of the second PMOS transistor Q21 is coupled to a first bias voltage, and a gate g22 of the second NMOS transistor Q22 is coupled to a second bias voltage. Both the drain d21 of the second PMOS transistor Q21 and the drain d22 of the second NMOS transistor Q22 are coupled to the input end 1a of the first inverting amplifier 1 through the impedance element Z. Values of the first bias voltage and the second bias voltage may be set by a person skilled in the art according to an actual application requirement or based on experience.

In this structure, the output end 1b of the first inverting amplifier 1 coupled to the drain d11 of the first PMOS transistor Q11 and the output end 1b of the first inverting amplifier 1 coupled to the drain d12 of the first NMOS transistor Q12 include two different output ends: a third output end 1c and a fourth output end 1d. To be specific, the drain d11 of the first PMOS transistor Q11 may be coupled to the third output end 1c of the output end 1b of the first inverting amplifier 1. The drain d12 of the first NMOS transistor Q12 may be coupled to the fourth output end 1d of the output end 1b of the first inverting amplifier 1. Signals generated by the two output ends 1b are different. Specifically, the generated two signals include small signals with a same phase, but have different large signal voltage bias.

In addition, a signal swing between a coupling point (that is, a feedback point of the feedback channel) of the drain d21 of the second PMOS transistor Q21 and the drain d22 of the second NMOS transistor Q22 and the impedance element Z depends on impedance of the impedance element Z. Therefore, the signal swing of the feedback point can be adjusted by designing the impedance of the impedance element Z, to improve linearity performance of the low noise amplifier. In addition, because a channel formed by the first PMOS transistor Q11, the second PMOS transistor Q21, the first NMOS transistor Q12 and the second NMOS transistor Q22 is in a high-impedance state. Therefore, noise of the impedance element Z is difficult to be output to the second output end Lc of the low noise amplifier. In other words, the impedance element Z does not introduce obvious noise.

Figure 9:
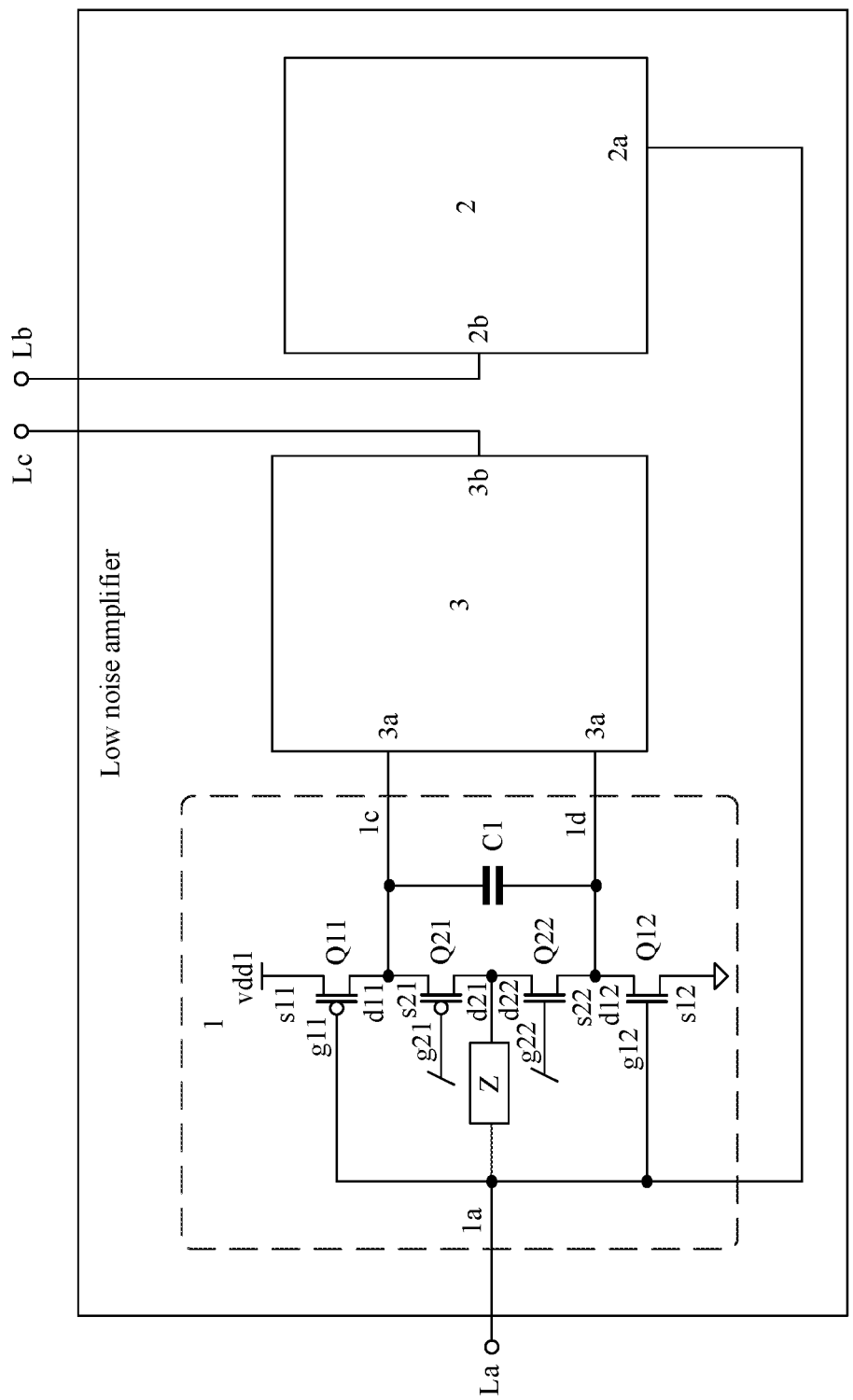
FIG. 9 is a schematic structural diagram of a seventh low noise amplifier according to an embodiment of this application.

Still further, refer to FIG. 9. The first inverting amplifier 1 may include a first capacitor C1, coupled between the third output end 1c and the fourth output end 1d of the first inverting amplifier 1. In this case, both a load of the first PMOS transistor Q11 and a load of the first NMOS transistor Q12 are a parallel structure of the second PMOS transistor Q21 and the second NMOS transistor Q22. Therefore, even if the signal swing is large, at least one of the second PMOS transistor Q21 and the second NMOS transistor Q22 is ensured to be conducted and normal output of the first inverting amplifier 1 is ensured. In this way, the load of the first PMOS transistor Q11 and the load of the first NMOS transistor Q12 are more linear, thereby effectively improving the linearity performance of the low noise amplifier.

It should be noted that the first PMOS transistor Q11 and the second PMOS transistor Q21 are a complementary input structure to the first NMOS transistor Q12 and the second NMOS transistor Q22. Therefore, even if the signal swing is large, an output channel of the first inverting amplifier 1 can always be conducted. This ensures performance of a 1 dB compression point of the low noise amplifier.

Figure 10:
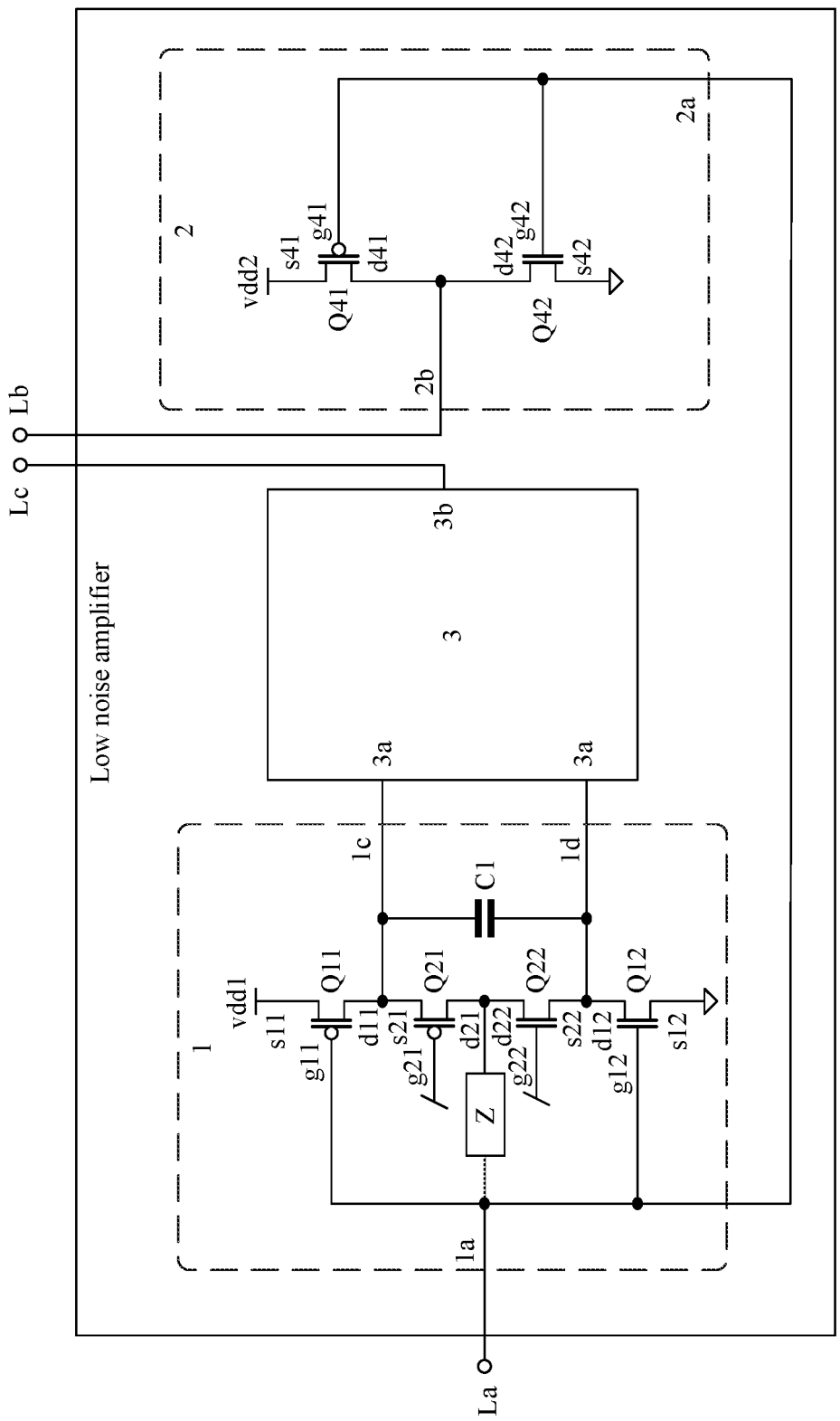
FIG. 10 is a schematic structural diagram of an eighth low noise amplifier according to an embodiment of this application.

The following describes a structure of the second inverting amplifier 2. Refer to FIG. 10. The second inverting amplifier 2 may include a fourth PMOS transistor Q41 and a fourth NMOS transistor Q42. A source s41 of the fourth PMOS transistor Q41 is coupled to a second power supply vdd2, a drain d41 of the fourth PMOS transistor Q41 is coupled to a drain d42 of the fourth NMOS transistor Q42 and a source s42 of the fourth NMOS transistor Q42 is grounded. Both the drain d41 of the fourth PMOS transistor Q41 and the drain d42 of the fourth NMOS transistor Q42 are coupled to the output end 2b of the second inverting amplifier 2. Both a gate g41 of the fourth PMOS transistor Q41 and a gate g42 of the fourth NMOS transistor Q42 are coupled to the input end 2a of the second inverting amplifier 2. In this case, the fourth PMOS transistor Q41 and the fourth NMOS transistor Q42 form an inverter structure, so that an output signal of the second inverting amplifier 2 can have a large swing, thereby effectively improving a dynamic range of the low noise amplifier. The second power supply vdd2 may be the same as or different from the first power supply vdd1. Both the second power supply vdd2 and the first power supply vdd1 have a constant voltage, and are configured to supply power to their respective inverting amplifiers. This is not limited in this embodiment of this application.

Figure 11:
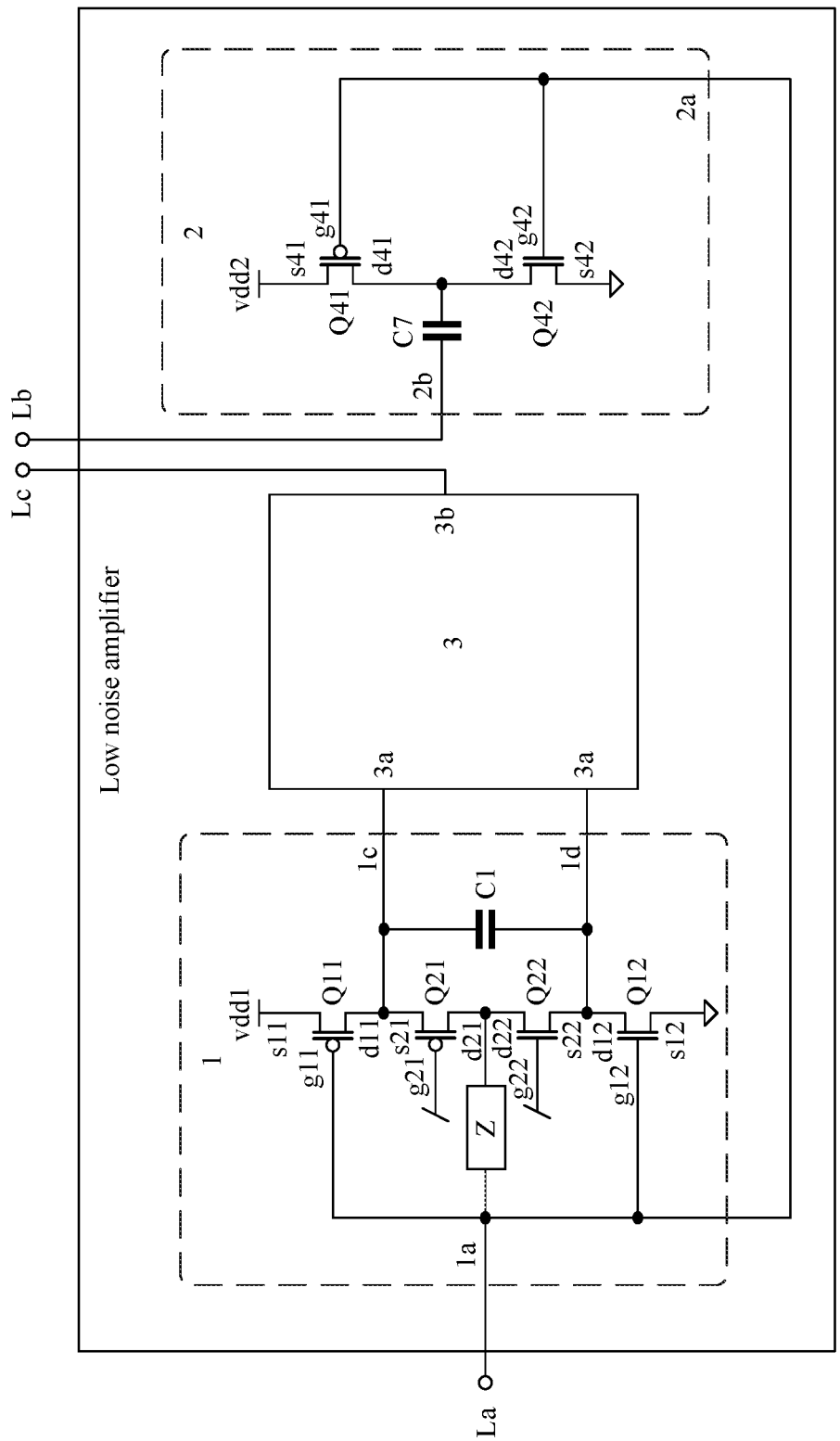
FIG. 11 is a schematic structural diagram of a ninth low noise amplifier according to an embodiment of this application.

Further, refer to FIG. 11. The second inverting amplifier 2 may include a seventh capacitor C7. Both the drain d41 of the fourth PMOS transistor Q41 and the drain d42 of the fourth NMOS transistor Q42 are coupled to the output end 2b of the second inverting amplifier 2 through the seventh capacitor C7. It should be noted that the seventh capacitor C7 has a direct-current blocking function, so that a direct-current signal in the low noise amplifier can be prevented from affecting a direct-current working point of a next-stage circuit, thereby ensuring normal working of the next-stage circuit.

Figure 12:
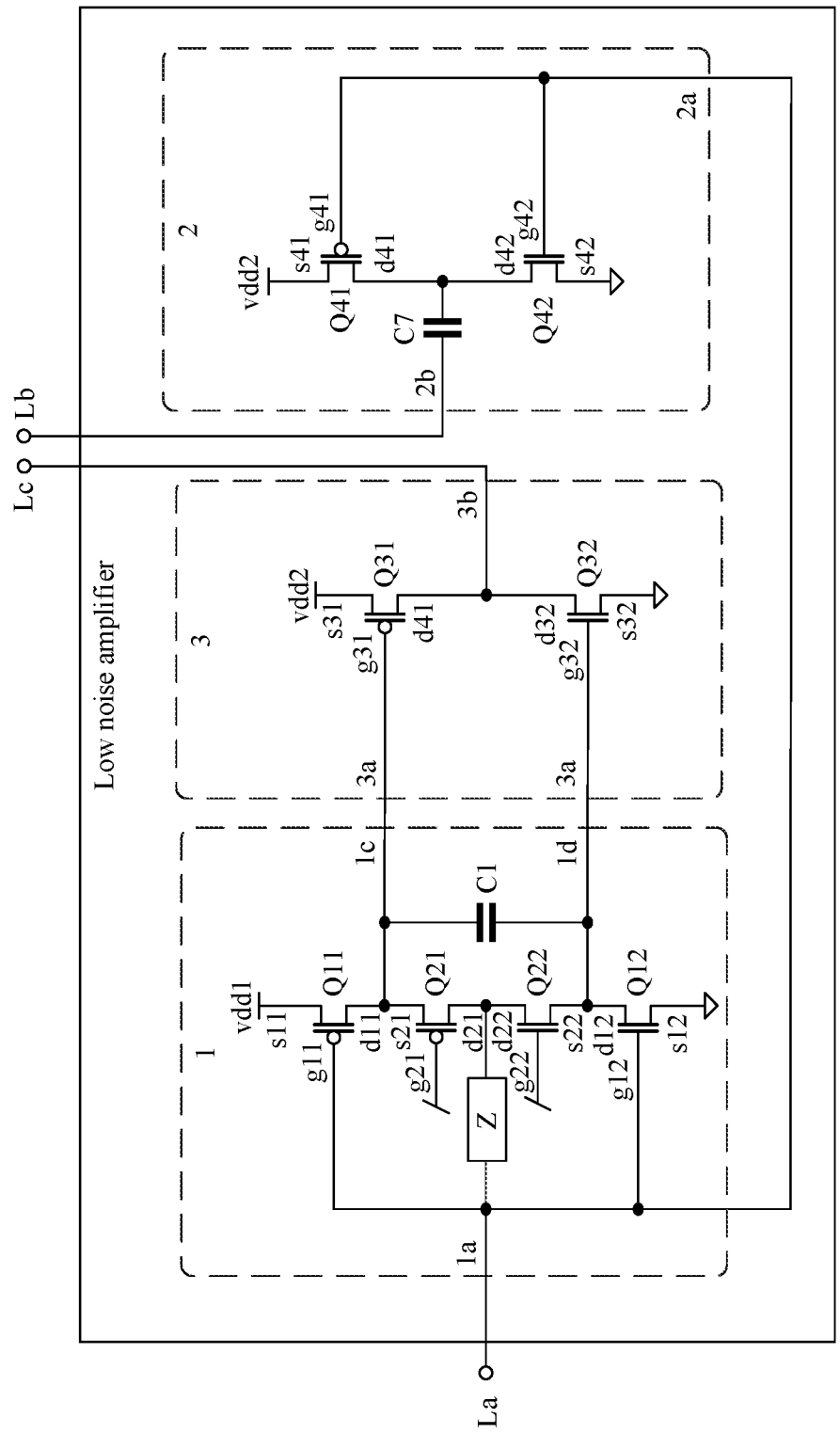
FIG. 12 is a schematic structural diagram of a tenth low noise amplifier according to an embodiment of this application.

The following describes a structure of the third inverting amplifier 3. Refer to FIG. 12. The third inverting amplifier 3 may include a third PMOS transistor Q31 and a third NMOS transistor Q32. A source of the third PMOS transistor is coupled to the second power supply vdd2, a drain d31 of the third PMOS transistor Q31 is coupled to a drain d32 of the third NMOS transistor Q32, and a source s32 of the third NMOS transistor Q32 is grounded. Both the drain d31 of the third PMOS transistor Q31 and the drain d32 of the third NMOS transistor Q32 are coupled to the output end 3b of the third inverting amplifier 3. A gate g31 of the third PMOS transistor Q31 is coupled to the third output end 1c of the first inverting amplifier 1, and a gate of the third NMOS transistor is coupled to the fourth output end 1d of the first inverting amplifier 1. In this case, the third PMOS transistor Q31 and the third NMOS transistor Q31 form an inverter structure, so that an output signal of the third inverting amplifier 3 can have a large swing, thereby effectively improving a dynamic range of the low noise amplifier.

Figure 13:
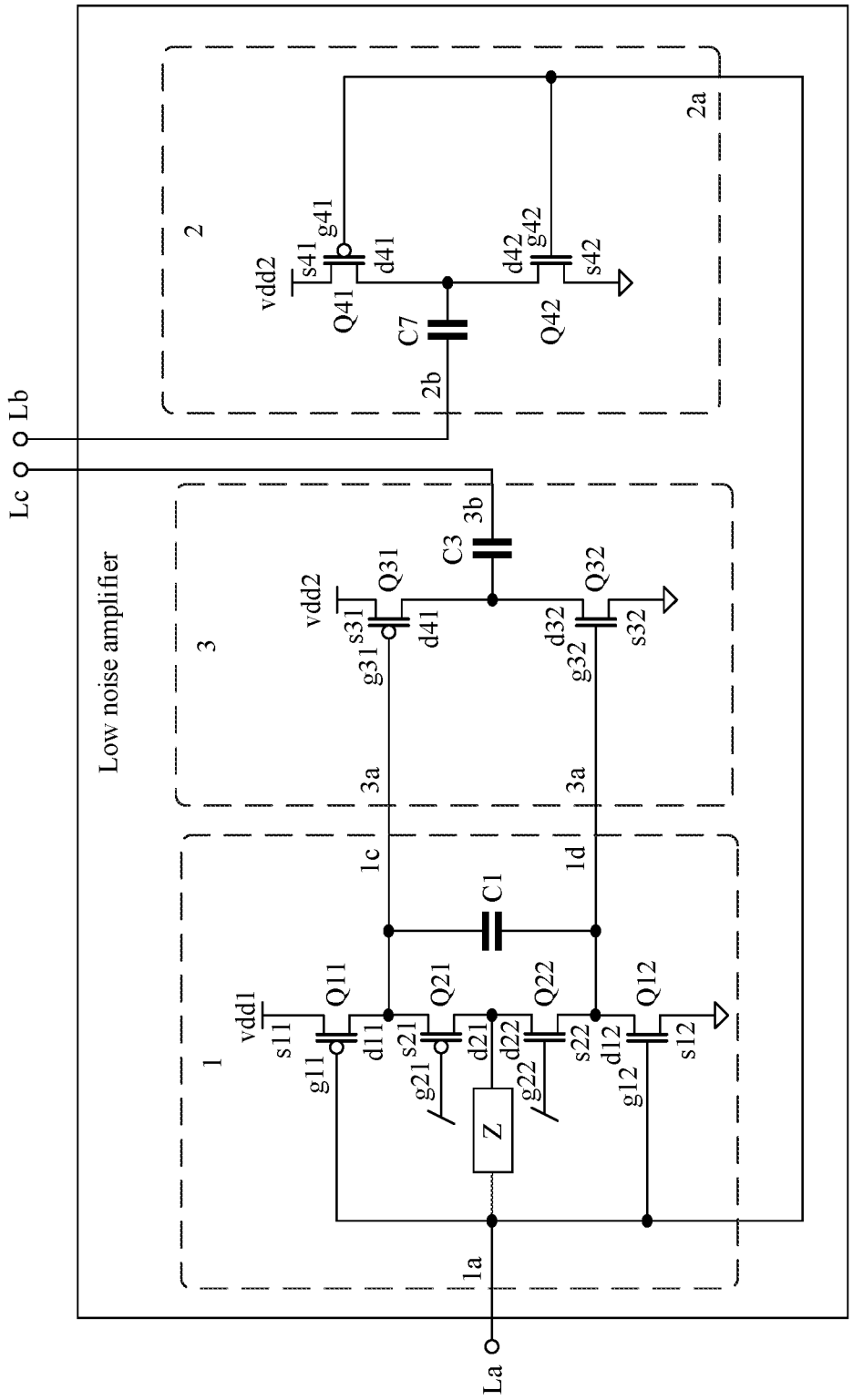
FIG. 13 is a schematic structural diagram of an eleventh low noise amplifier according to an embodiment of this application.

Further, refer to FIG. 13. The second inverting amplifier 2 may further include a third capacitor C3. Both the drain d31 of the third PMOS transistor Q31 and the drain d32 of the third NMOS transistor Q32 are coupled to the output end 3b of the third inverting amplifier 3 through the third capacitor C3. It should be noted that the third capacitor C3 has a direct-current blocking function, so that the direct-current signal in the low noise amplifier can be prevented from affecting the direct-current working point of a next-level circuit, thereby ensuring normal working of the next-level circuit.

In the foregoing structure, to ensure that the noise caused by the first PMOS transistor Q11 and the first NMOS transistor Q12 at the first output end Lb of the low noise amplifier has an equal magnitude as the noise caused by the first PMOS transistor Q11 and the first NMOS transistor Q12 at the second output end Lc of the low noise amplifier. A design may be made so that the transconductance value of the first PMOS transistor Q11 is equal to a transconductance value of the second PMOS transistor Q21, the transconductance value of the first NMOS transistor Q12 is equal to a transconductance value of the second NMOS transistor Q22, a transconductance value of the third PMOS transistor Q31 is equal to a transconductance value of the fourth PMOS transistor Q41, and a transconductance value of the third NMOS transistor Q32 is equal to a transconductance value of the fourth NMOS transistor Q42.

Figure 14:
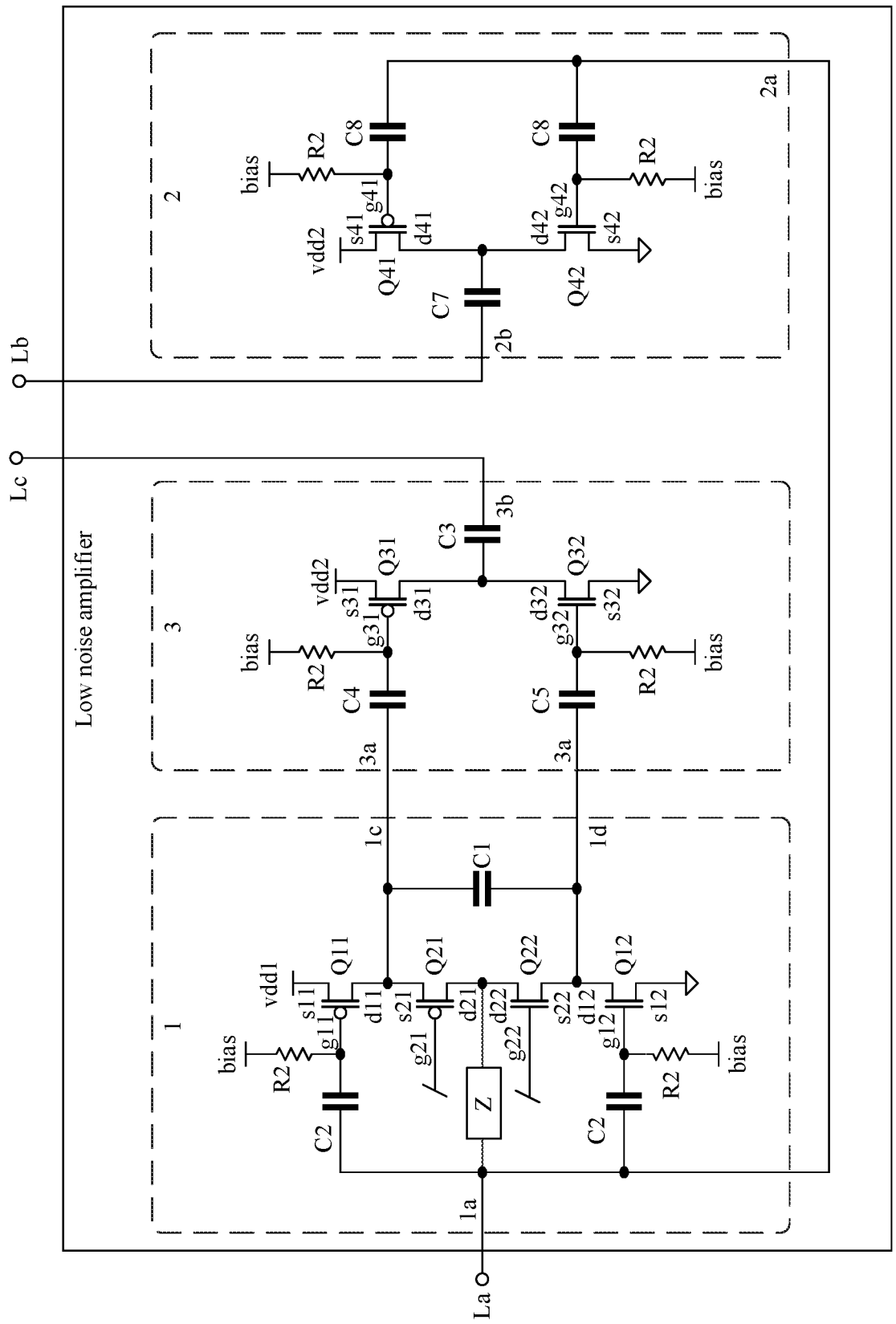
FIG. 14 is a schematic structural diagram of a twelfth low noise amplifier according to an embodiment of this application.

Further, to ensure that the MOS transistor can work normally, referring to FIG. 14, the gates of the first PMOS transistor Q11, the first NMOS transistor Q12, the third PMOS transistor Q31, the third NMOS transistor Q32, the fourth PMOS transistor Q41, and the fourth NMOS transistor Q42 may all be coupled to a bias voltage bias used to provide a direct-current working point. For example, the gate of any one of the six MOS transistors may be connected to a corresponding bias voltage bias through a second resistor R2, and a value of the bias voltages bias corresponding to each MOS transistor may be set to the same or different. Each bias voltage bias may provide the direct-current working point for a corresponding MOS transistor through a corresponding second resistor R2, to ensure that the MOS transistor can work normally.

In addition, refer to FIG. 14. The gates of the first PMOS transistor Q11, the first NMOS transistor Q12, the third PMOS transistor Q31, the third NMOS transistor Q32, the fourth PMOS transistor Q41, and the fourth NMOS transistor Q42 may all be coupled to an input end of a corresponding inverting amplifier through a capacitor. The capacitor has a direct-current blocking function, so that a direct-current signal in the input end of each inverting amplifier can be prevented from affecting a direct-current working point of the corresponding MOS transistor.

For example, the first inverting amplifier 1 may further include one or more second capacitors C2, and at least one of the gate g12 of the first PMOS transistor Q11 and the gate g12 of the first NMOS transistor Q12 is coupled to the input end 1a of the first inverting amplifier 1 through the second capacitor C2. The third inverting amplifier 3 may further include a fourth capacitor C4 and a fifth capacitor C5. The gate g31 of the third PMOS transistor Q31 is coupled to the third output end 1c of the first inverting amplifier 1 through the fourth capacitor C4, and the gate g32 of the third NMOS transistor Q32 is coupled to the fourth output end 1d of the first inverting amplifier 1 through the fifth capacitor C5. The second inverting amplifier 2 may further include an eighth capacitor C8. Both the gate g41 of the fourth PMOS transistor Q41 and the gate g42 of the fourth NMOS transistor Q42 are coupled to the input end 2a of the second inverting amplifier 2 through the eighth capacitor C8.

In this embodiment of this application, there may be no inductor in the low noise amplifier. Therefore, the low noise amplifier has a smaller area and a larger frequency range, to implement broadband matching. In this way, a wide frequency range can be covered by using only a small quantity of low noise amplifiers, so that an area of the low noise amplifier can be reduced.

It should be understood that "at least one" mentioned in the embodiments of this application may be described as one or more. The term "include" refers to a non-exclusive inclusion, to be specific, in addition to the mentioned elements, other elements may also be included. "A and/or B" refers to one or all of A or B. "Coupling" refers to electrical connection or electrical coupling, and includes direct connection through a wire or connection through other elements.

The foregoing descriptions are merely embodiments of this application, but are not intended to limit this application. Any modification, equivalent replacement, or improvement made without departing from the spirit and principle of this application should fall within the protection scope of this application. For example, although this embodiment uses the low noise amplifier as an example for description, and describes a technical solution and beneficial effects thereof, the single-ended-to-differential amplifier that has the foregoing structure may be applicable to another application scenario, such as a variable gain amplifier, to implement a single-ended-to-differential function and reduce a quantity of input ends without using an inductor. In addition, an amplifier structure in a specific embodiment may be an integrated circuit in a chip, or may be a discrete component, or may be a combination thereof. For example, in the foregoing embodiments, other components other than the capacitor and the resistor, for example, each MOS transistor, may be an integrated circuit as a part of a radio frequency chip or another chip, and the capacitor and the resistor are discrete components. Alternatively, optionally, one or more resistors may be an integrated circuit in the chip. Alternatively, optionally, one or more capacitors may also be an integrated circuit in the chip. In this case, the one or more capacitors may be MOS transistor capacitors. A specific implementation is not limited in this embodiment.

The invention claimed is:

1. A single-ended-to-differential amplifier, comprising a first inverting amplifier, a second inverting amplifier, and a third inverting amplifier, wherein:
   both an input end of the first inverting amplifier and an input end of the second inverting amplifier are coupled to an input end of the single-ended-to-differential amplifier, an output end of the first inverting amplifier is coupled to an input end of the third inverting amplifier, an output end of the second inverting amplifier is coupled to a first output end of the single-ended-to-differential amplifier, and an output end of the third inverting amplifier is coupled to a second output end of the single-ended-to-differential amplifier;
   an impedance element included in the first inverting amplifier is coupled between the input end of the first inverting amplifier and the output end of the first inverting amplifier;
   the first inverting amplifier comprises a first P-metal-oxide-semiconductor (PMOS) transistor and a first n-metal-oxide-semiconductor (NMOS) transistor;
   a source of the first PMOS transistor is coupled to a first power supply, a drain of the first PMOS transistor is coupled to a drain of the first NMOS transistor, a source of the first NMOS transistor is grounded;
   the drain of the first PMOS transistor is coupled to the output end of the first inverting amplifier, the drain of the first NMOS transistor is coupled to the output end of the first inverting amplifier;
   both the drain of the first PMOS transistor and the drain of the first NMOS transistor are coupled to the input end of the first inverting amplifier through the impedance element; and
   both a gate of the first PMOS transistor and a gate of the first NMOS transistor are coupled to the input end of the first inverting amplifier.

2. The single-ended-to-differential amplifier according to claim 1, wherein the first inverting amplifier is a unity-gain inverting amplifier.

3. The single-ended-to-differential amplifier according to claim 1, wherein:
   the first inverting amplifier further comprises a second PMOS transistor and a second NMOS transistor;
   the drain of the first PMOS transistor is coupled to a source of the second PMOS transistor, a drain of the second PMOS transistor is coupled to a drain of the second NMOS transistor, and a source of the second NMOS transistor is coupled to the drain of the first NMOS transistor;
   a gate of the second PMOS transistor is coupled to a first bias voltage, and a gate of the second NMOS transistor is coupled to a second bias voltage;
   both the drain of the second PMOS transistor and the drain of the second NMOS transistor are coupled to the output end of the first inverting amplifier through the impedance element; and
   the drain of the first PMOS transistor is coupled to a third output end of the first inverting amplifier, and the drain of the first NMOS transistor is coupled to a fourth output end of the first inverting amplifier.

4. The single-ended-to-differential amplifier according to claim 3, wherein the first inverting amplifier further comprises a first capacitor coupled between the third output end and the fourth output end.

5. The single-ended-to-differential amplifier according to claim 1, wherein the first inverting amplifier further comprises a second capacitor, and wherein at least one of the gate of the first PMOS transistor and the gate of the first NMOS transistor is coupled to the input end of the first inverting amplifier through the second capacitor.

6. The single-ended-to-differential amplifier according to claim 3, wherein the third inverting amplifier comprises a third PMOS transistor and a third NMOS transistor, and wherein:
   a source of the third PMOS transistor is coupled to a second power supply, a drain of the third PMOS transistor is coupled to a drain of the third NMOS transistor, and a source of the third NMOS transistor is grounded;
   both the drain of the third PMOS transistor and the drain of the third NMOS transistor are coupled to the output end of the third inverting amplifier; and
   a gate of the third PMOS transistor is coupled to the third output end, and a gate of the third NMOS transistor is coupled to the fourth output end.

7. The single-ended-to-differential amplifier according to claim 6, wherein the third inverting amplifier further comprises a third capacitor, and wherein both the drain of the third PMOS transistor and the drain of the third NMOS transistor are coupled to the output end of the third inverting amplifier through the third capacitor.

8. The single-ended-to-differential amplifier according to claim 6, wherein the third inverting amplifier further comprises a fourth capacitor and a fifth capacitor, and wherein the gate of the third PMOS transistor is coupled to the third output end through the fourth capacitor, and the gate of the third NMOS transistor is coupled to the fourth output end through the fifth capacitor.

9. The single-ended-to-differential amplifier according to claim 1, wherein the impedance element comprises at least one of a first resistor and a sixth capacitor.

10. The single-ended-to-differential amplifier according to claim 1, wherein the second inverting amplifier comprises a fourth PMOS transistor and a fourth NMOS transistor, and wherein:
    a source of the fourth PMOS transistor is coupled to a second power supply, a drain of the fourth PMOS transistor is coupled to a drain of the fourth NMOS transistor, and a source of the fourth NMOS transistor is grounded;
    both the drain of the fourth PMOS transistor and the drain of the fourth NMOS transistor are coupled to the output end of the second inverting amplifier; and
    both a gate of the fourth PMOS transistor and a gate of the fourth NMOS transistor are coupled to the input end of the second inverting amplifier.

11. The single-ended-to-differential amplifier according to claim 10, wherein the second inverting amplifier further comprises a seventh capacitor, and wherein both the drain of the fourth PMOS transistor and the drain of the fourth NMOS transistor are coupled to the output end of the second inverting amplifier through the seventh capacitor.

12. The single-ended-to-differential amplifier according to claim 10, wherein the second inverting amplifier further comprises an eighth capacitor, and wherein both the gate of the fourth PMOS transistor and the gate of the fourth NMOS transistor are coupled to the input end of the second inverting amplifier through the eighth capacitor.

13. A radio frequency receiver, comprising a single-ended-to-differential low noise amplifier and a mixer, wherein:
    the single-ended-to-differential low noise amplifier comprises a first inverting amplifier, a second inverting amplifier, and a third inverting amplifier;

both an input end of the first inverting amplifier and an input end of the second inverting amplifier are coupled to an input end of the single-ended-to-differential low noise amplifier, an output end of the first inverting amplifier is coupled to an input end of the third inverting amplifier, an output end of the second inverting amplifier is coupled to a first output end of the single-ended-to-differential low noise amplifier, and an output end of the third inverting amplifier is coupled to a second output end of the single-ended-to-differential low noise amplifier;

an impedance element included in the first inverting amplifier is coupled between the input end of the first inverting amplifier and the output end of the first inverting amplifier;

the mixer is coupled to the first output end and the second output end;

the first inverting amplifier comprises a first P-metal-oxide-semiconductor (PMOS) transistor and a first n-metal-oxide-semiconductor (NMOS) transistor;

a source of the first PMOS transistor is coupled to a first power supply, a drain of the first PMOS transistor is coupled to a drain of the first NMOS transistor, a source of the first NMOS transistor is grounded;

the drain of the first PMOS transistor is coupled to the output end of the first inverting amplifier, the drain of the first NMOS transistor is coupled to the output end of the first inverting amplifier; both the drain of the first PMOS transistor and the drain of the first NMOS transistor are coupled to the input end of the first inverting amplifier through the impedance element; and both a gate of the first PMOS transistor and a gate of the first NMOS transistor are coupled to the input end of the first inverting amplifier.

14. The radio frequency receiver according to claim 13, wherein the first inverting amplifier is a unity-gain inverting amplifier.

15. The radio frequency receiver according to claim 13, wherein:

the first inverting amplifier further comprises a second PMOS transistor and a second NMOS transistor;

the drain of the first PMOS transistor is coupled to a source of the second PMOS transistor, a drain of the second PMOS transistor is coupled to a drain of the second NMOS transistor, and a source of the second NMOS transistor is coupled to the drain of the first NMOS transistor;

a gate of the second PMOS transistor is coupled to a first bias voltage, and a gate of the second NMOS transistor is coupled to a second bias voltage;

both the drain of the second PMOS transistor and the drain of the second NMOS transistor are coupled to the output end of the first inverting amplifier through the impedance element; and the drain of the first PMOS transistor is coupled to a third output end of the first inverting amplifier, and the drain of the first NMOS transistor is coupled to a fourth output end of the first inverting amplifier.

16. The radio frequency receiver according to claim 15, wherein the first inverting amplifier further comprises a first capacitor coupled between the third output end and the fourth output end.

17. The radio frequency receiver according to claim 13, wherein the first inverting amplifier further comprises a second capacitor, and wherein at least one of the gate of the first PMOS transistor and the gate of the first NMOS transistor is coupled to the input end of the first inverting amplifier through the second capacitor.

18. The radio frequency receiver according to claim 13, wherein the impedance element comprises at least one of a first resistor and a sixth capacitor.

\* \* \* \* \*